United States Patent
Fifield et al.

(10) Patent No.: US 6,373,771 B1
(45) Date of Patent: Apr. 16, 2002

(54) INTEGRATED FUSE LATCH AND SHIFT REGISTER FOR EFFICIENT PROGRAMMING AND FUSE READOUT

(75) Inventors: John A. Fifield, Underhill; Wayne F. Ellis, Jericho, both of VT (US); Nicholas M. van Heel, Eagle, ID (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/765,035

(22) Filed: Jan. 17, 2001

(51) Int. Cl.[7] .................................................. G11C 7/00
(52) U.S. Cl. ................ 365/225.7; 365/201; 365/189.05
(58) Field of Search ............................. 365/225.7, 201, 365/96, 154, 189.05, 189.12

(56) References Cited

U.S. PATENT DOCUMENTS

| | | |
|---|---|---|
| 4,532,607 A | 7/1985 | Uchida |
| 4,773,046 A | 9/1988 | Akaogi et al. |
| 5,206,583 A | 4/1993 | Dawson et al. |
| 5,300,840 A | 4/1994 | Drouot |
| 5,345,110 A | 9/1994 | Renfro et al. |
| 5,446,864 A | 8/1995 | Burghardt et al. |
| 5,471,040 A | 11/1995 | May |
| 5,471,427 A * | 11/1995 | Murakami et al. ........... 365/200 |
| 5,668,818 A | 9/1997 | Bennett et al. |
| 5,831,923 A | 11/1998 | Casper |
| 5,889,679 A | 3/1999 | Henry et al. |
| 6,038,168 A | 3/2000 | Allen et al. |
| 6,240,033 B1 * | 5/2001 | Yang et al. ............... 365/225.7 |

FOREIGN PATENT DOCUMENTS

JP     200090689 A   *  3/2000   ........... G11C/29/00

OTHER PUBLICATIONS

IBM Technical Disclosure Bulletin, Volatile Redundancy Fuseselection and Read Back, vol. 32, No. 6B, Nov. 1989, pp. 450 and 451.

* cited by examiner

*Primary Examiner*—David Nelms
*Assistant Examiner*—David Lam
(74) *Attorney, Agent, or Firm*—Schmeiser, Olsen & Watts; Steven Capella

(57) ABSTRACT

An integrated circuit device that obviates laser programming of a two-state element (e.g., a wire fuse or antifuse) by programming (i.e., changing) the conductive state of the two-state element according to a binary bit of programing data serially scanned in. Thereafter, the device can verify the actual programming of the two-state element by sensing the conducting condition and then serially scanning out the conductive state value of the two-sate element as a binary logic bit). The device provides the functionality of being able to test any on-chip non-memory circuitry that depends on a memory circuit being fully functional and operational while still at the wafer tester and before having to "blow" (i.e., program) any fuses.

24 Claims, 10 Drawing Sheets

INTEGRATED FUSE LATCH AND SHIFT REGISTER FOR EFFICIENT PROGRAMMING AND FUSE READOUT

BACKGROUND OF THE INVENTION

1. Technical Field

The invention relates generally to programmable fuse circuitry, and more particularly, to programming fuses electronically and verifying the states of such programmed fuses, via a shift-register.

2. Related Art

Fuses and antifuses (collectively anti/fuses) are often used to permanently store binary data on an IC. Binary logic states are represented by the binary conductive state of the anti/fuse, being either "ON" (i.e., conducting) and "OFF" (i.e., nonconducting). The related art depicted in FIG. 1 provides a plurality of (i.e. bank of) series connected circuit elements (e.g. circuit element 18) that each include a Master-Slave type shift-register (e.g. Digital Flip-Flop, DFF), to read-out the state of multiple on-chip fuses (e.g., 12a) after programming (e.g., by laser-blow) has been performed. These circuits 18 allow the actual state of programmable fuses circuits to be loaded from fuse latches (e.g., 42) in parallel into the bank of Master-Slave shift-registers (DFF) and then to be shifted serially to the output 36 of the shift-register bank where the state of the programable fuses can be read out.

The related art depicted in FIG. 1 provides a three-latch design comprising a fuse latch 42, a shift register master latch 44, and a shift register slave latch 46. The circuit 18 of related art provides the functionality of being able to verify the laser-programming state of fuses 12a that have each been incorporated within a voltage-divider network comprised of a load device (14a) and a fuse (12a) connected in series between the supply voltage and ground. The state of each fuse is observed by (e.g., read into) the fuse latch 42 via a fuse output line 32 at the connection between the fuse 12a and the load device 14a.

A data pattern can be serially scanned through the Shift Register 16 of a first stage out to a second Shift Register 16 of a second stage. This is achieved by sequentially activating the CK gate 64a and the CKN gate 66a with the signal CK and the signal CKN, respectively. This is an example of a conventional master-slave latch configuration. The data moves from master to slave in a first stage, from master to slave in a second stage, and so on to subsequent stages.

The related art circuit 18 of FIG. 1 is able to observe, but not to change the conductive state of the fuse 12a, and therefore requires that the final programming of the metal wire fuse 12a be performed externally (e.g., by laser fuse-blow at a laser programming station). The related art circuit 18 also draws current (i.e., consumes energy) through a non-blown metal wire fuse element 12a whenever the power supply voltage VDD is applied to the circuit, thus unnecessarily consuming power.

SUMMARY OF THE INVENTION

The present invention overcomes the limitations and deficiencies of the related art described above. The inventive circuit can perform final non-volatile programming of 2-state elements (e.g. fuses, anti-fuses, and electromechanical switches) via a serial shrift-register, obviating laser programming. An additional feature of the present invention is that it can verify the programming of a programmable anti/fuse circuit containing a plurality of anti/fuse elements (by serially scanning out the programmed anti/fuse values). A fuse latch is coupled to the two-state element (e.g., antifuse element) to determine whether it is in a conducting (i.e., low resistance) mode or non-conducting (i.e., high resistance) mode, corresponding to respective "ON" and "OFF" conditions, by pulling-down a latch input node voltage when "ON."

Embodiments of the present invention provide a fuse programming and verification circuit that can program capacitative antifuses, conductive wire fuses (and other 2-state elements) and then verify and serially read out the actual state of such elements after programming. The inventive circuits provide the functionality of being able to verify the programming of the anti/fuse elements by sensing the conductive states of all the anti/fuse elements after selected elements have been programmed and scanning out that conductive state information as binary data. Additionally, the inventive circuits provide the functionality of being able to test any non-memory circuitry that depends on the memory being fully functional and operational while still at the wafer tester before having to "blow" (i.e., program) any fuses.

In a first embodiment, the foregoing functionality is achieved by a fuse programming and verification circuit implemented in a three-latch design comprising a fuse latch, a shift register master latch, and a shift register slave latch. In a second embodiment, the foregoing functionality is achieved by a fuse programming and verification circuit implemented in a two-latch design comprising an integrated fuse-master shift register latch, and a shift register slave (hold) latch. In alternative embodiments of the invention, the fuse element may be implemented by any two-state device, such as an anti-fuse or even a micro-, nano- or pico-electromechanical switch.

Accordingly, a first aspect of the invention provides a device for programming and verifying a non-volatile two-state element, including: a two-state element having a binary conductive state; and a latch operatively coupled to the two-state element being adapted to sense the conductive state of the two-state element, and being further adapted to store a binary bit representing the conductive state; and a logic gate operatively coupled to the two-state element for changing the conductive state of the two-state element according to a binary bit of programing data.

A second aspect of the invention provides method for programming and verifying a plurality of two-state elements, the method including scanning in programming data, then changing the conductive state of each two-state element of a subset of the plurality of two-state elements according to the programing data, and sensing and storing the conductive states of all the two-state elements as binary verification data and then scanning out the verification data.

The foregoing and other features of the invention will be apparent from the following detailed description of embodiments of the invention, as illustrated in the accompanying drawings.

BRIEF DESCRIPTION OF THE DRAWINGS

Exemplary embodiments of the present invention will hereinafter be described in conjunction with the appended drawings, where like designations denote like elements, and wherein:

FIG. 3c depicts a circuit diagram of an alternative embodiment of the FPAVISR device of FIG. 3a;

FIG. 3d depicts a circuit diagram of an alternative embodiment of the FPAVISR device of FIG. 3a;

FIG. 3e depicts a circuit diagram of an alternative embodiment of the FPAVISR device of FIG. 3a;

FIG. 4 depicts a timing diagram illustrating the operation of the FPAV devices of FIG. 2b and FIG. 3a.

The features of the invention, its uses, and methods of operation will be better understood when consideration is given to the following detailed description thereof. Such description makes reference to the annexed drawings.

DETAILED DESCRIPTION OF THE INVENTION

Figure 1:
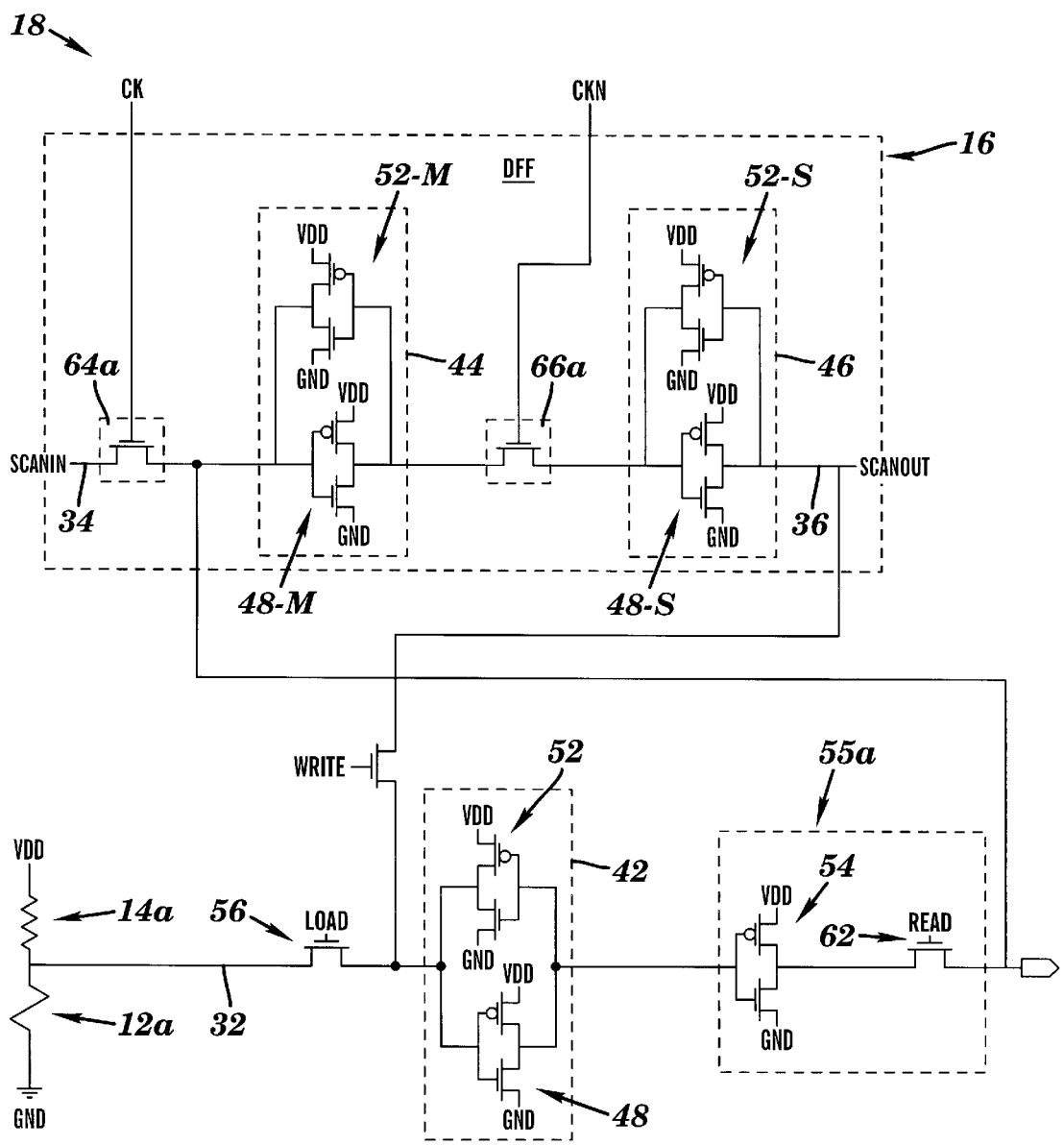
FIG. 1 depicts a block diagram of a Master Slave Shift Register coupled to a fuse latch of the related art for detecting the conductive state of a laser-blown fuse element coupled thereto.
Figure 2A:
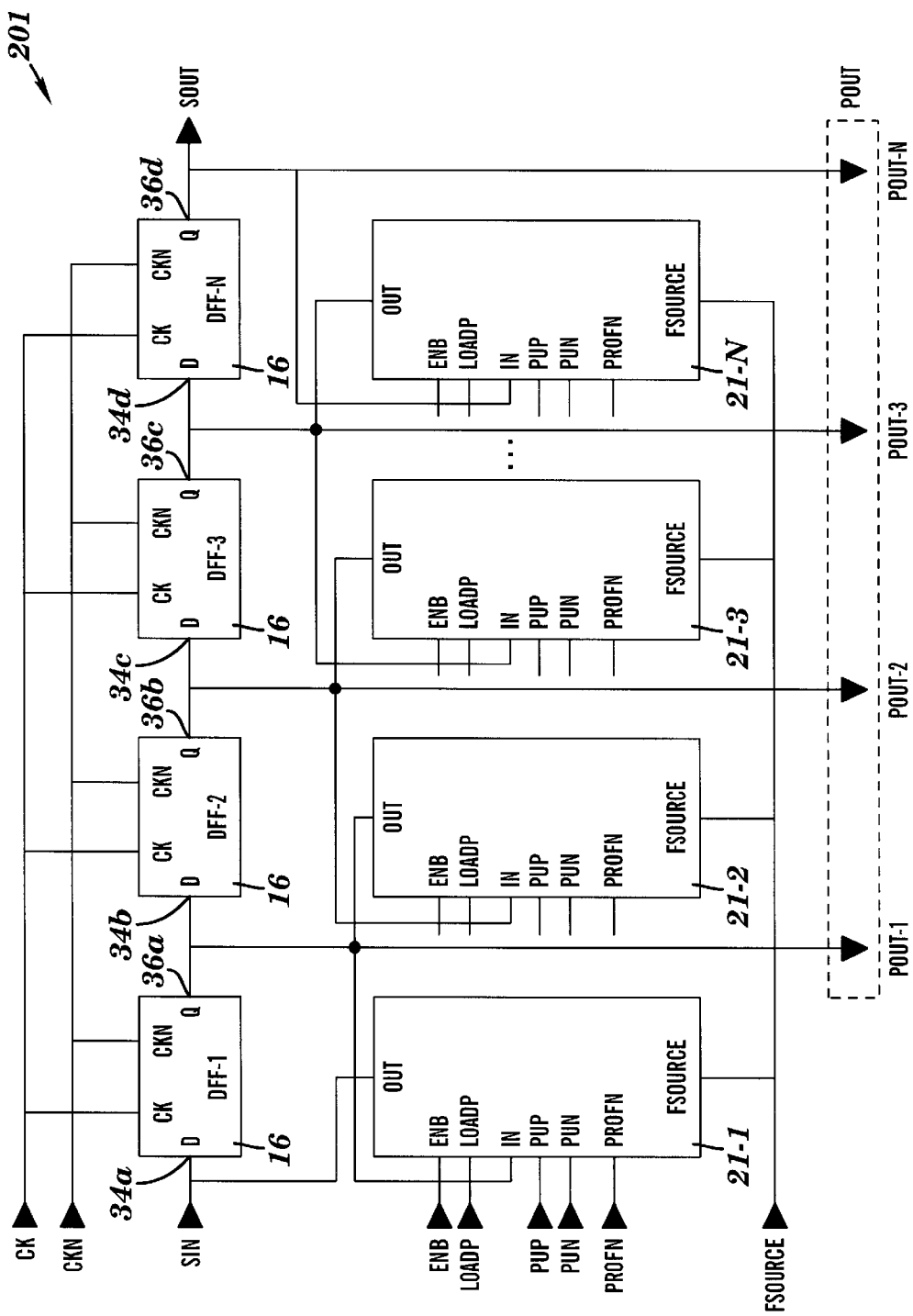
FIG. 2a depicts block diagram of a bank of Shift Registers operatively coupled to a plurality of Fuse Programming and Verifying (FPAV) devices in accordance with a first embodiment of the invention.

FIG. 2a depicts a circuit 201 comprising bank of shift registers (DFF-1, DFF-2, DFF-3, DFF-N) coupled to a bank of corresponding fuse programming and verification devices (e.g. 21-1, 21-2, 21-3, 21-N) (hereinafter, collectively FPAV device 21). Each of the N series-connected stages of the circuit 201 comprises three-latches, in accordance with a first embodiment of the invention. In each of the N stages, the first and second latches (e.g., a shift register master latch 44 and a shift register slave latch 46) are comprised within each Digital Flip-Flop 16 (e.g., DFF-1, DFF-2, DFF-3, or DFF-N) and provide the shift-register function for transporting information in and out of the circuit 201. Each shift register 16 (e.g., DFF-1, DFF-2, DFF-3, or DFF-N) has a SCAN INput line 34 and a SCAN OUTput line 36 (as shown in digital flip flop 16 of FIG. 1 which is incorporated herein by reference). The third latch is a novel fuse latch 43 (see circuit diagram in FIG. 2b) inside of each FPAV device 21 (e.g., 21-1, 21-2, 21-3 or 21-N). Each FPAV device 21 (e.g., 21-1, 21-2, 21-3 or 21-N) is adapted to receive fuse programming data via INput line IN, to program a fuse (see FIGS. 2b–2c) or an other 2-state device (see FIG. 2d), and to verify the conductive state of the programmed fuse etc. and assert such programmed fuse data at its OUTput line.

Each shift register 16 (e.g., DFF-1, DFF-2, DFF-3, and DFF-N) is controlled by the alternating complementary clock signals CK and CKN as in the related art. A string of serially coupled DFFs (e.g., DFF-1, DFF-2, DFF-3, and DFF-N) form a bank of N (i.e., N is a positive integer) shift registers. A bank of N fuse programming and verification devices 21 (e.g., 21-1, 21-2, 21-3, 21-N) is operatively coupled to the bank of N shift registers. The bank of shift registers (e.g., DFF-1, DFF-2, DFF-3, and DFF-N) can: serially scan fuse programming data in via the Serial INput line SIN; assert the fuse programming data in parallel at the N INput lines IN of each respective FPAV (i.e., 21-1, 21-2, 21-3, 21-N), or at a set of N Parallel OUTput lines POUT; load programmed fuse verification data in parallel from the N OUTput lines OUT of the N fuse programming and verification (FPAV) devices 21; serially scan programmed fuse verification data out via the Serial OUTput line SOUT.

Figure 2B:
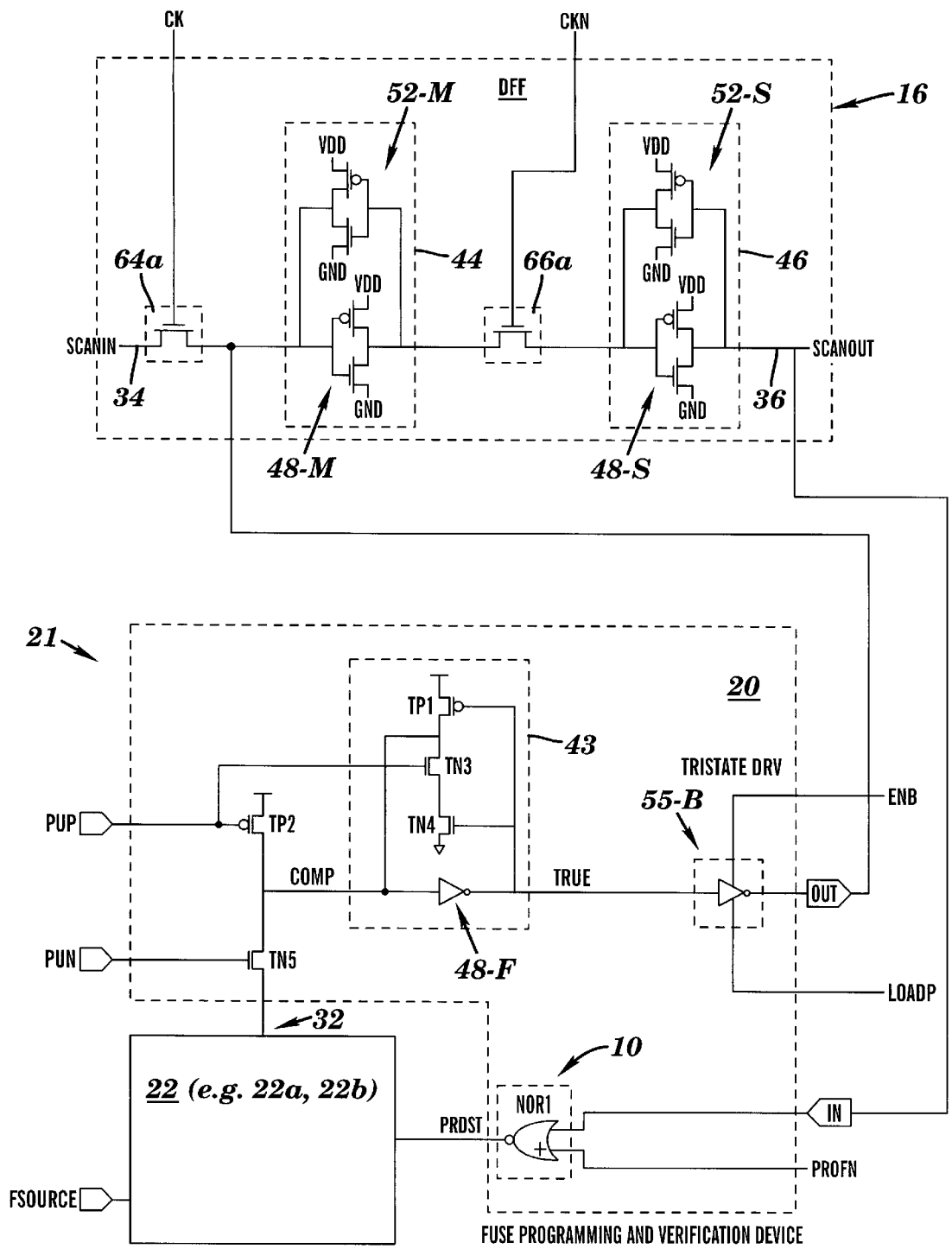
FIG. 2b depicts a circuit diagram of a single Fuse Programming and Verifying (FPAV) device of FIG. 2a operatively coupled to the shift register (DFF) of FIG. 1 in accordance with a first embodiment of the invention.

The structure and methods of operation of a first embodiment of the invention depicted in FIG. 2a may be better understood in conjunction with FIG. 2b which depicts a circuit diagram showing the internal structure of a single fuse programming and verifying (FPAV) device of FIG. 2a operatively coupled to the shift register (DFF) of FIG. 1. The shift register master latch 44 of each shift register (DFF) 16 of FIG. 2a has two alternative forward inputs: one input SCANIN for receiving fuse programing data (e.g., via SIN); the other input for receiving programmed fuse verification data from a FPAV device 21 via line OUT. By activating the transfer gate 64a (by asserting the shift clock signal CK), the fuse programming data value at a SCANIN port (line 34, e.g. lines 34a of DFF-1 in FIG. 2a) is loaded serially into the shift register master latch 44 (e.g., DFF-1). Alternatively, by activating the tri-state driver 55b of the fuse programming and verification device (FPAV) 21, (by asserting the control signal ENB and/or LOADP), the programmed fuse verification data value at the OUT port of the FPAV device 21 is loaded into the shift register master latch 44.

Figure 3A:
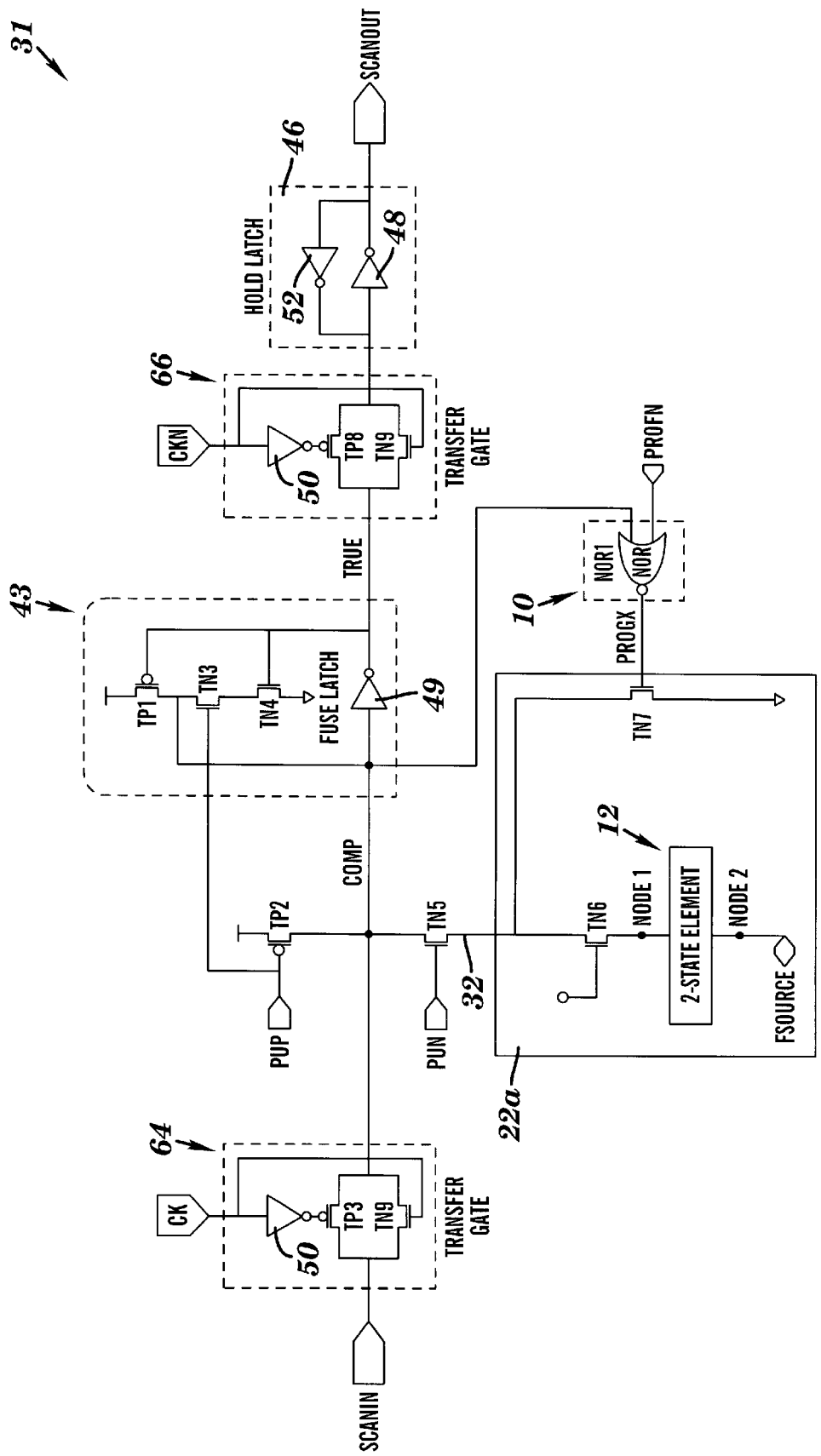
FIG. 3a depicts a circuit diagram of a Fuse Programming and Verification device having Integrated Shift-Register functions (i.e., an FPAVISR device) in accordance with a second embodiment of the invention.

The shift register slave latch 46 has a single forward input gated by transfer gate 66a (note: alternative gate structures may be used, such as gate 66 of FIG. 3a) which includes a gating-signal-complementing inverter 50. The transfer gate 66a is connected to and controlled by the complementary shift clock signal CKN. By activating the transfer gate 66a by asserting CKN, the output of the shift register master latch 44 is latched to the SCANOUT port (line 36, e.g., line 36a).

Each of the shift register's latches (i.e., master 44, and slave 46) are implemented with a normal forward inverter 48 (referring collectively to forward inverters 48-M and 48-S) and a weak feedback inverter 52 (referring collectively to feedback inverters 52-M and 52-S). The inverters 48 and 52 are each constructed of two complementary (N-Type and P-Type) stacked field-effect transistors (FETs) configured as shown and as well known in the industry. Each of the transfer gates 64a and 66a may be implemented as a single pass-switch transistor as shown in FIG. 1, or as a complementary pair of parallel pass-switch transistors (e.g., TP3 and TN9 in 64 of FIG. 3a) as depicted in FIG. 3a. The relative size of the normal forward inverter 48-M of the shift register master latch 44 will be larger than the size of the weak feedback inverter 52-S of the shift register slave latch 46, so that when the signal CKN turns the transfer gate 66a ON (i.e., conducting), the data value stored in the master latch 44 will be transferred into the slave latch 46. That is, the data asserted by the normal forward inverter 48-M of the shift register master latch 44 will overdrive the weak feedback inverter 52-S of the slave latch 46. Then, the output of the forward inverter 48-S of the slave latch 46, that is, the inverse of the data from the master latch 44, will drive the weak feedback inverter 52-S of the slave latch 46 so as to create a positive feedback, and thus, creating a bistable latch 46 storing the information. Similarly, the inverter in the tri-state driver 55b connected to the output (i.e., TRUE) of the fuse latch 43 within the FPAV device 21 will be larger than the size of the weak feedback inverter 52-M of the shift register master latch 44, so that when the signal ENB and/or LOADP turns the transfer gate 55b ON (i.e., conducting) (and while transfer gate 64a is OFF), the data value stored in the fuse latch 43 will be transferred into the shift register master latch 44. That is, the data asserted by the Tri-state driver 55a will overdrive the weak feedback inverter 52-M of the shift register master latch 44 and the bit of programmed fuse verification data stored in the fuse latch 43 will be written into the shift register master latch 44.

The INput line IN of each fuse programming and verification device 21 (e.g., 21-1, 21-2, 21-3 or 21-N) is connected to the SCANOUT line 36 of each respective shift register (e.g., DFF-1, DFF-2, DFF-3 or DFF-N) in order to receive therefrom one Bit of the fuse programming data. The output line OUT of each fuse programming and verification device 21 (e.g., 21-1, 21-2, or 21-3) is connected to the SCANOUT line 36 of each respective shift register (e.g., DFF-1, DFF-2, DFF-3 or DFF-N) and to the SCANIN line 34 of each next shift register (e.g., DFF-2, DFF-3 or DFF-N) in order to transmit one Bit of the programmed fuse verification data into the next shift register.

Figure 2C:
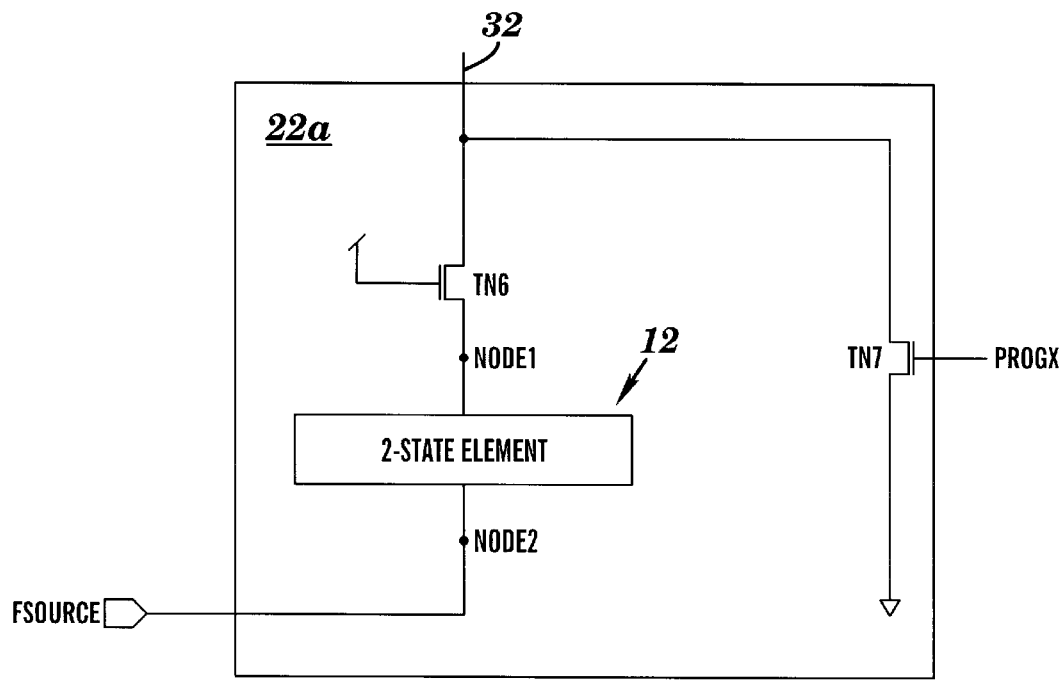
FIG. 2c depicts a circuit diagram of programmable 2-state circuit including a 2-state fusible element adapted to being integrated with and programmed and verified by the Fuse Programming and Verifying (FPAV) device of FIGS. 2b, 3a, 3c and 3d.
Figure 2D:
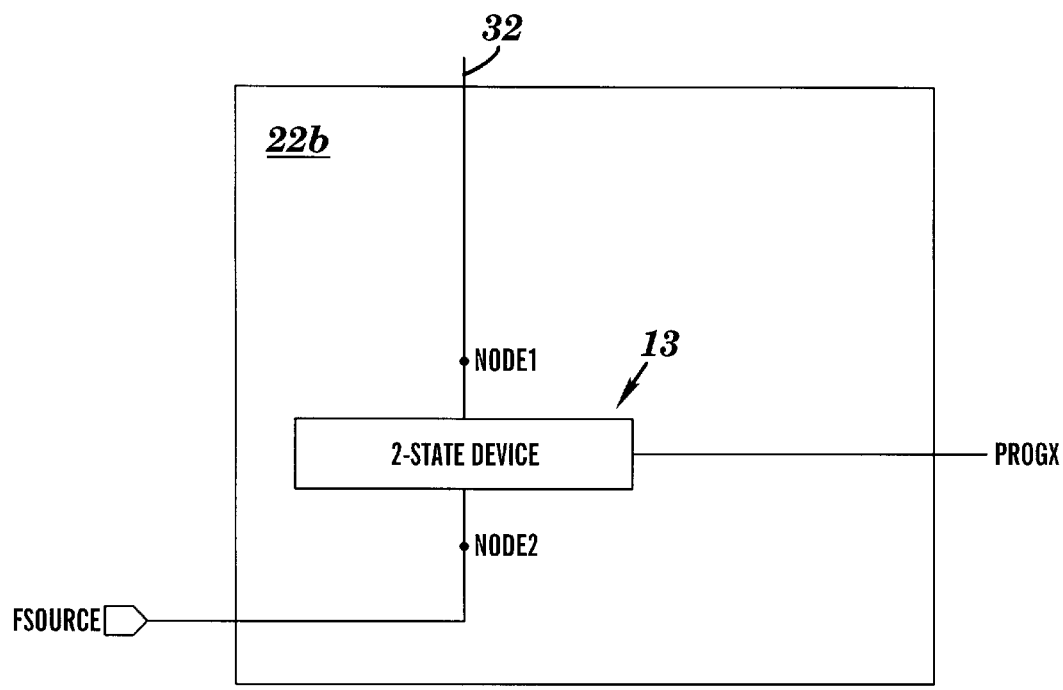
FIG. 2d depicts a block diagram of programmable 2-state circuit including a 2-state device adapted to being integrated with and programmed and verified by the Fuse Programming and Verifying (FPAV) device of FIGS. 2b, 3a, 3c and 3d.

The operation of the novel fuse programming and verification (FPAV) device 21 may be better understood with further reference to the detailed circuit diagrams in FIGS. 2b, 2c, 2d. The FPAV device 21 contains a programable two-state circuit 22 which may be implemented in numerous ways, including by each of the exemplary programable two-state circuits 22a, 22b depicted in FIGS. 2c, 2d, 3d, and 3e. The two-state circuit 22 may be implemented with 2-state element such as a wire fuse, an antifuse, or a pass-gate or a switch, or with any non-volatile 2-state device having a binary conductive state characterized by whether the element or 2-state device is conducting (i.e., having low resistance) or nonconducting (i.e., having high resistance). Such a non-volatile 2-state device may include an SRAM cell modified post-fabrication (e.g., by Hot-e effects) such that it operates as a nonvolatile storage cell (e.g., controlling a pass-gate which could be regarded as being a 2-state element), or by a mechanical switch (which may be regarded as a 2-state element) such as a micro electro mechanical (MEM) switch.

The operation of the FPAV device 21 is controlled by a plurality of control signals (i.e., PUP, PUN, ENB, LOADP and PROFN) plus a Fuse-blow-voltage-source line FSOURCE as depicted in FIGS. 2a and 2b. An overview of verification operation of FPAV 21 comprising circuit 22a is as follows: the fuse latch is adapted to read (i.e., verify after programming) the binary conductive state (i.e., being either conducting or nonconducting) of the non-volatile two-state element 12 by initializing the fuse latch 43 to a known state by turning ON (i.e., conducting) pull-up transistor TP2 while holding OFF (i.e., nonconducting) pass-switch transistor TN5, and thereafter holding pull-up transistor TP2 OFF while turning pass-switch transistors TN3 and TN5 ON, and while holding pull-down transistor TN7 OFF, and while holding line FSOURCE to Low (e.g., ground voltage) so that the state (i.e., conducting or nonconducting) of the two-state element (e.g., 12 in FIG. 2c) will be detected by and stored (i.e., latched) in the fuse latch 43 and output as a binary logic voltage level at line OUT of the tri-state driver 55b.

A Bit of the fuse programming data (i.e., a Bit asserted by the SCANOUT port 36 of the shift register 16 at the input line IN of the FPAV device 21) can be permanently written into (i.e., programmed into) the two-state element 12 (e.g., a metal wire fuse, a semiconductor wire fuse, or a capacitor based anti-fuse) within the FPAV device 21 when PROgram-Fuse-Not control signal PROFN is asserted (i.e., PROFN's active voltage is Low) and pass-switch transistor TN5 is OFF (i.e., nonconducting when control signal PUN is Low) by raising the voltage on line FSOURCE to a sufficiently high voltage (for example, between 2volts and 10 volts for a thin oxide dielectric) to change the state of the two-state element 12 (e.g., an antifuse 12 in 2-state circuit 22a of FIGS. 2b and 2c) from its initial (i.e., as-fabricated) conductive state (e.g., a nonconducting dielectric condition of a capacitive antifuse) to a "blown" (i.e., programmed) state (e.g., to a shorted antifuse state). Whether a typical two-state element 12 in two-state circuit 22a will be "blown" (i.e., changed from its as-fabricated state) when a high voltage or a current is asserted on line FSOURCE, depends upon whether pass-switch transistor TN7 is ON (i.e., conducting) or OFF (i.e., non-conducting), which depends upon on the logic value of the bit of fuse programing data asserted at the IN line of the FPAV device 21, and upon the state of (active Low) control signal PROFN.

In the exemplary embodiments that include the two-state circuit 22a of FIG. 2c, the high voltage on the FSOURCE line/node may be asserted at a node (e.g., Node 2) of the two-state element 12 independently of the logic value of the bit of fuse programing data asserted at the IN line of the FPAV device 21. All lines (e.g. 32) and transistors (e.g., TN5) coupled to the two-state element 12 may be potentially subjected to the high voltage on line FSOURCE if no protection were provided. Accordingly, a protection FET TN6 is provided to sufficiently protect control circuit 20 during fuse-blow. When the gate of protection FET TN6 is coupled to a DC voltage source, the voltage asserted at line 32 will not exceed that DC voltage.

The two-state element 12 to be "blown" may be a fuse (e.g. metal wire or a semiconductor wire) having an unprogrammed "ON" state, in which the fuse is fabricated, that presents a relatively low resistance between the fuse terminals at Node 1 and Node 2. The fuse can be programmed to an "OFF" state having a high resistance connection between the fuse terminals (i.e., between Node 1 and Node 2). The fuse (i.e., fuse element 12) may be a metal wire which has two states: either 1) conductive or 2) nonconductive, depending upon whether the fuse has been blown during programming. Alternatively, a polysilicon or silicide wire could be used in place of the metal wire. The fuse wire may be formed as a damascene metal wiring layer or other metalization layer on an integrated circuit chip.

Alternatively, the two-state element 12 may be an antifuse fabricated with a structure similar to that of a capacitor; two electrically conductive plates are separated by a dielectric layer. An unprogrammed "OFF" state, in which the antifuse is fabricated, presents a high resistance between the antifuse terminals at Node 1 and Node 2. The antifuse can be programmed to an "ON" state where a low resistance connection between the antifuse terminals is desired. To program an antifuse "ON," a large programming voltage is applied (i.e., from line FSOURCE) across the antifuse terminals at Node 1 and Node 2, breaking down the interposed dielectric and forming a conductive link between the antifuse terminals.

The two-state circuit 22 of FIG. 2b may comprise a two-state device 13 as depicted in FIG. 2d, wherein the two-state device 13 has a non-volatile ON (i.e., conducting) state and an nonvolatile OFF (i.e., nonconducting) state. The two-state device 13 may comprise a nonvolatile two-logic-state (i.e., binary) memory device such as SRAM cell modifiable (i.e., programable) after fabrication (e.g., by Hot-e effects) such that it operates as a nonvolatile storage cell (e.g., controlling a pass-gate). The two-state device 13 may also comprise an electromechanical switch, such as a Micro Electro Mechanical System (MEMS) switch (e.g., a single pole-single throw switch, or a rotary switch), or a nano-scale machine, having a non-volatile ON (i.e., conducting) state and an non-volatile OFF (i.e., nonconducting) state between Node 1 and Node 2. In embodiments wherein such a two-state device 13 is included in the two-state circuit 22, it may be unnecessary to provide a high voltage on line FSOURCE. Accordingly, the protection-FET TN6 may be eliminated from the two-state circuit 22a to provide the alternative two-state circuit 22b.

Data that enters the first shift register DFF-1 will be serially scanned through the bank of shift registers (DFF-1, DFF-2, DFF-3 etc.) until the time Ready-To-Program (See timing diagram in FIG. 4) when such data shall have been stored in and is asserted in-parallel at the outputs of the shift registers (e.g., POUT-1, POUT-2, POUT-3, etc.) each of which is connected to the input line IN of each respective FPAV device 21 (e.g., 21-1, 21-2, 21-3, etc.). When the fuse programming data is asserted at the input line IN of each FPAV device 21, the active-Low PROgram-Fuse-Not signal PROFN may be asserted (held Low) such that logic gate 10 (e.g., NOR1 in FIG. 2b) can output an active-High PROGram-fuse-True signal PROGT depending upon the logic value of the bit of fuse programming data asserted at line IN. When signal PROGT is active (i.e., High and FSOURCE is at a higher voltage level, a two-state element 12 (e.g., antifuse) within the two-state circuit 22a will be "programmed" (e.g., changed from an initially nonconducting to a relatively conducting conductive state).

During fuse programming, the active-High signal PROGT will turn ON (i.e., conducting) the fuse-blow-current-pass-switch transistor TN7 within the programable two-state circuit 22a. Meanwhile, pass-switch transistor TN5 shall have been turned OFF (i.e. non-conducting) and the Fuse-blow-voltage-source line FSOURCE shall have been raised to a higher voltage level (e.g., higher than the nominal supply voltage of the FPAV device). Therefore, if fuse-blow-current-pass-switch transistor TN7 is ON (according to the logic value of the bit of fuse programming data that is asserted at the input line IN of each FPAV device 21) while PROFN is Low, a fuse-blowing current and/or an antifuse-shorting voltage will pass across the two-state element 12 (e.g., a metal wire fuse element or a capacitive antifuse element) between Node1 and Node2, thereby changing the state of the two-state element 12 from an inherent (i.e., unprogrammed) state to an opposite programmed state.

Figure 4:
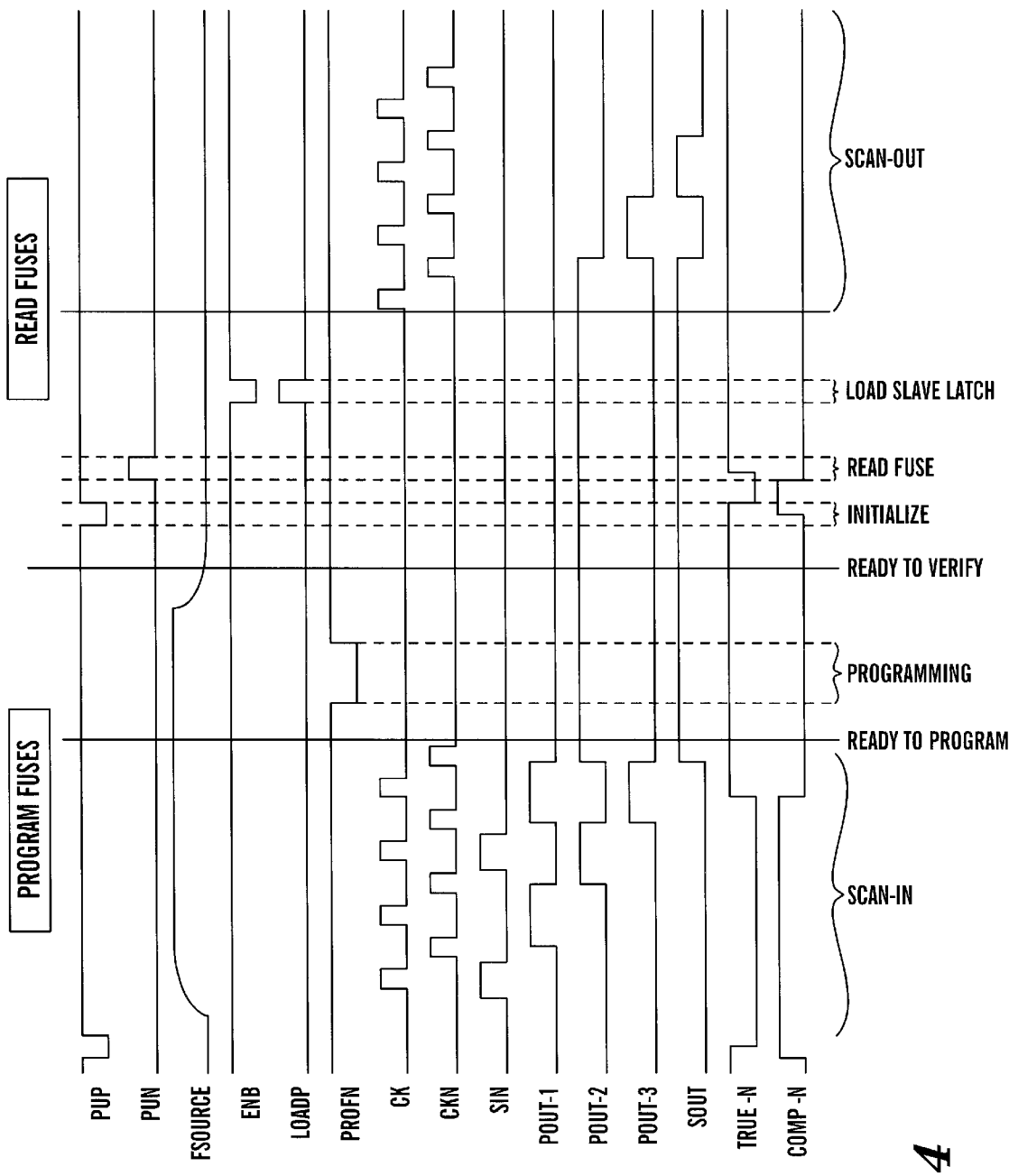

The timing diagram of FIG. 4 further illustrates the details and manner of the operation of the fuse programming and verification device 21. FIG. 4 depicts the voltage levels on a plurality of nodes and lines during exemplary operations for programming an antifuse (i.e., writing data to the non-volatile two-state element 12) and for verifying (reading) the state of such a antifuse 12 after such programming. As depicted in the timing diagram in FIG. 4, data that enters the first shift register DFF-1 will be serially scanned through the bank of shift registers (DFF-1, DFF-2, DFF-3 etc.) until the time Ready-To-Program when such data shall have been stored in and is asserted in-parallel at the outputs of the shift registers (e.g., POUT-1, POUT-2, POUT-3, etc.) each of which is connected to the input line IN of each respective FPAV device 21 (e.g., 21-1, 21-2, 21-3, etc.).

When the fuse programming data is asserted at the input line IN of each FPAV device 21, the active-Low PROgram-Fuse-Not signal PROFN may be asserted (held Low) such that logic gate 10 (e.g., NOR1 in FIG. 2b) can output an active-High PROGram-fuse-True signal PROGT- depending on the Bit of fuse programming data asserted at line IN. The active High PROGT voltage will turn ON (i.e., conducting) the fuse-blow-current-pass-switch transistor TN7 within the programable two-state circuit 22. Meanwhile, pass-switch transistor TN5 shall have been turned OFF (i.e. non-conducting) and the Fuse-blow-voltage-source line FSOURCE shall have been raised to a higher voltage level (e.g., higher than the nominal supply voltage of the FPAV device). Therefore, if fuse-blow-current-pass-switch transistor TN7 is ON (according to the bit of fuse programming data that is asserted at the input line IN of each FPAV device 21) while PROFN is Low, a fuse-blowing current and/or an antifuse-shorting voltage will pass across the two-state element 12 (e.g., a metal wire fuse element or a capacitive antifuse element) between Node1 and Node2, thereby changing the state of the two-state element 12 from an inherent (i.e., unprogrammed) state to an opposite programmed-state.

The circuit 21 enters a Ready-to-Verify mode when the anti/fuses have been programmed and when the voltage on line FSOURCE has been pulled to ground, as depicted in the timing diagram in FIG. 4. Verification is performed in two steps: First, the fuse latch 43 is initialized to a known logic state (e.g., the logic state inconsistent with the conducting condition of the binary conductive state of the two-state element 12), e.g., a logic High on node/line COMP corresponding to lack of a conductive link between node/line COMP and ground (e.g., ground voltage on line FSOURCE); Second, the pass-switch transistor TN5 is turned ON (i.e. conductive) (while weak pull-up transistor TP1 is ON, and while pass-switch transistor TN3 is OFF) thus either pulling the node/line COMP down towards ground (i.e., towards the Low voltage on line FSOURCE) or pulling node/line COMP up towards the Supply Voltage through TP1, depending upon the actual conducting/nonconducting condition of the binary conductive state of the two-state element 12. At the same time, the binary state of the node/line COMP is inverted by the forward inverter 48 so that the binary state will be stored (i.e., latched) in fuse latch 43 when signal PUN returns to Low voltage.

The First step for verification is performed by pulsing active-Low signal PUP Low for a period of time (e.g., the period labeled "initialize" in FIG. 4) that is sufficiently long to impart the known state to the fuse latch 43. The first step may be performed once at the Power-UP time of the equipment that includes the FPAVISR device. The second step for verification is performed by pulsing active-High signal PUN high for a period of time (e.g., the period labeled "read fuse" in FIG. 4) that is sufficiently long to detect and latch the conductive state of the two-state circuit 22. Thereafter, the fuse programming data stored in fuse latch 43 can be transferred via the Tristate Driver 55b into the Shift Register Master Latch 44 as previously noted.

The transfer of data from the fuse latch 43 to Shift Register Master Latch 44 occurs when the Tristate Driver 55b is gated ON (i.e., inverting) by control signal ENB and/or control signal LOADP. The tristate driver may be implemented as a stack of four field effect transistors (FETS), such as for example, two PFETs stacked above two NFETs wherein the gate of a first NFET and the gate of a first PFET are connected to line/node TRUE to perform an inverting driver function, and wherein the gate of the second NFET and the gate of the second PFET are controlled by signal LOADP and its logical complement (e.g., signal ENB) respectively. Alternatively, the tristate driver function of circuit 55a may be performed by the circuit 55a depicted in FIG. 1.

As depicted in the timing diagram in FIG. 4, the control signal LOADP is the logical complement of control signal ENB. Accordingly, signal ENB may be inverted (e.g., by an inverter not shown) to provide signal LOADP, and vice versa.

Fuse Programming and Verification with Integrated Shift-Register (FPAVISR) Circuit FIG. 3a depicts an embodiment of the invention implemented by a two-latch circuit 31 wherein the fuse latch 43 functions also as a shift register master latch. FIG. 3a depicts a circuit diagram of an Integrated Shift-Register Fuse Programming and Verification (FPAVISR) device 31 comprising an Integrated Fuse-Master Latch 43 (i.e., fuse latch 43), a hold latch (i.e., a shift-register slave latch) 46, and a two-state circuit 22 (i.e., 22a including a two-state element 12). The Integrated Fuse-Master Latch 43 and the shift-register slave latch 46 operate in conjunction with the Transfer Gates 64 and 66 (controlled by clock signals CK and CKN respectively) in the same manner as a Digital Flip Flop 16 to provide the shift-register function for transporting information serially in (i.e., via SCANIN) and out (i.e., via SCANOUT) of the FPAVISR circuit 31.

A string of serially coupled FPAVISR circuits 31 (e.g., 31-1, 31-2, 31-3, and 31-N) form a bank of N (i.e., N is a positive integer) FPAVISR circuits 31. A bank of (i.e., a plurality of serially-connected) FPAVISR circuits 31 (e.g., 31-1, 31-2, 31-3, and 31-N depicted in FIG. 3b) can: serially scan fuse programming data in via the Serial INput line SIN; load fuse programming data in parallel in via the lines (at SCANIN) coupled to the N FPAVISR circuits 31; assert the fuse programming data or programmed fuse verification data out in parallel at the N Parallel OUTput lines (i.e. POUT-1, POUT-2, POUT-3, POUT-N); serially scan programmed fuse verification data out via the Serial OUTput line SOUT.

Each of the two latches 43 and 46 are implemented with a normal forward inverter, (49 and 48 respectively), and a corresponding weak feedback inverter (e.g., 52). The feedback inverter function of the Integrated Fuse-Master Latch 43 is performed by the inverting CMOS transistor pair comprising pull-up transistor TP1 and pull-down transistor TN4.

The pull-down function of transistor TN4 of the feed-back inverter of the Integrated Fuse-Master Latch 43 is selectively interruptible (i.e. gated), by pass-switch transistor TN3 which is controlled by control signal PUP so that the Integrated Fuse-Master Latch 43 may be forced to a known state (i.e., Node TRUE pulled Low and Node COMP pulled High) during an initialization for fuse verification. In alternative embodiments, wherein the latch-initializing pull-up transistor TP2 is sufficiently larger than pull-down transistor TN4, pass-switch transistor TN3 may be omitted and/or replaced with a resistive element.

The inverters 48, 49 and 52 are each constructed of two complementary field-effect transistors (FET) configured as shown and as well known in the industry. Each of the transfer gates 64 and 66 may be implemented as a complementary pair of parallel pass-switch transistors (e.g., TP3 and TN9 in 64 of FIG. 3a) as depicted in FIG. 3a, or less preferably, as a single pass-switch transistor as shown in the Digital Flip Flop shown in FIG. 1.

The relative size of the normal forward inverter 49 of the Integrated Fuse-Master Latch 43 will be larger than the size of the weak feedback inverter 52 of the shift register slave latch (Hold Latch) 46, so that when the signal CKN turns the transfer gate 66 ON (i.e., conducting), the data value stored in the Integrated Fuse-Master Latch 43 will be transferred into the slave latch 46. That is, the data asserted by the normal forward inverter 49 of the Integrated Fuse-Master Latch 43 will overdrive the weak feedback inverter 52 of the slave latch 46. Then, the output of the forward inverter 48 of the slave latch 46, that is, the inverse of the data from the Integrated Fuse-Master Latch 43, will drive the weak feedback inverter 52 of the slave latch 46 so as to create a positive feedback, and thus, creating a bistable latch 46 storing the information from the Integrated Fuse-Master Latch 43, whereupon the transfer is completed and the Transfer-Gate 66 may be turned OFF (i.e., non-conducting).

Figure 3B:
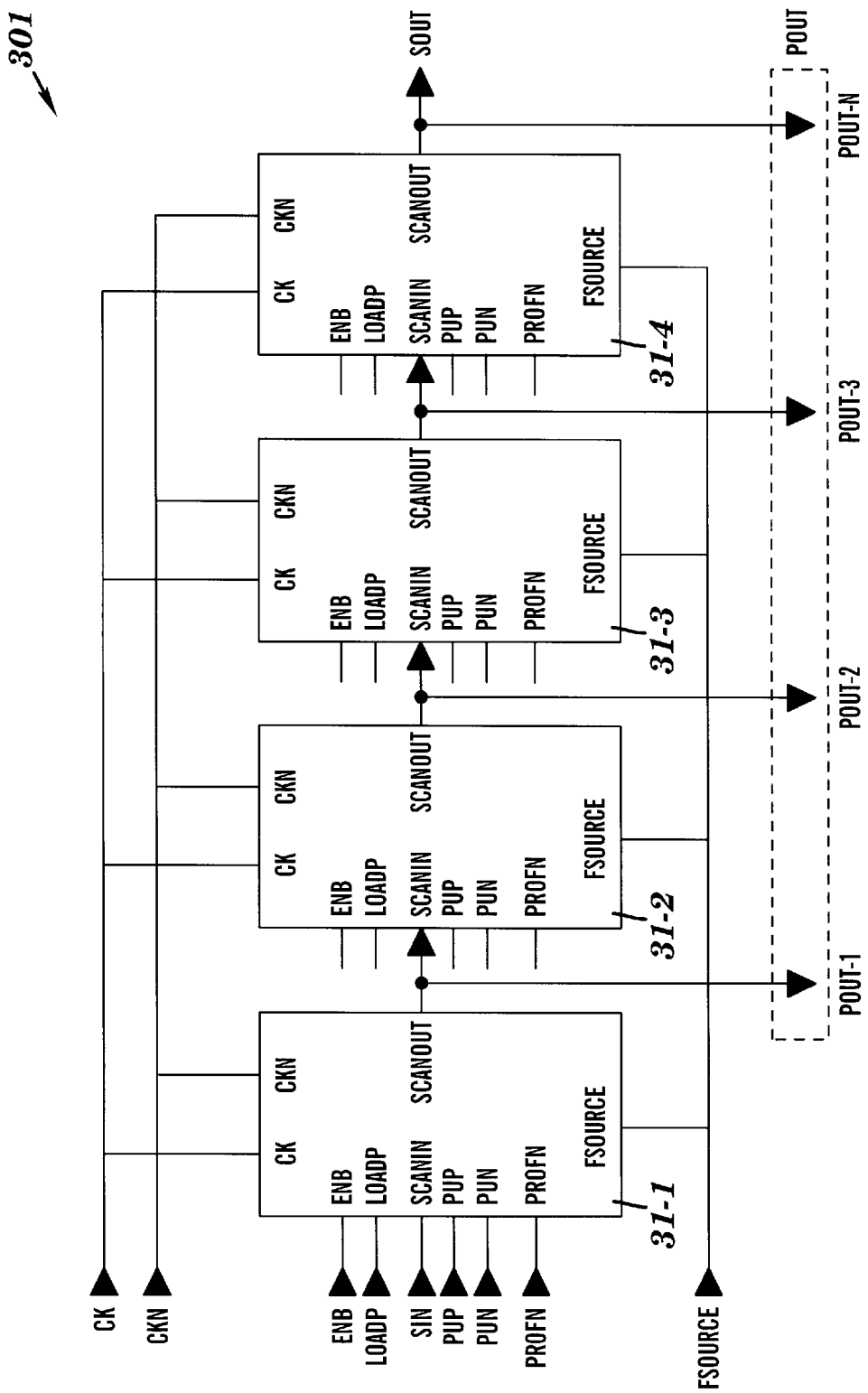
FIG. 3b depicts a block diagram illustrating a bank of the FPAVISR device of FIG. 3a, providing a Parallel Output and a Serial Output.

Similarly, the relative size of the normal forward inverter 48 of a shift register slave latch (Hold Latch) 46 will be larger than the size of the weak feedback inverter (i.e., comprised of transistors TP1 and TN4) of an Integrated Fuse-Master Latch 43, so that when the clock signal CK turns the transfer gate 64 ON (i.e., conducting), the data value stored in the shift register slave latch (Hold Latch) 46 of a first serially coupled device 31 (e.g., device 31-1 as depicted in FIG. 3b) will be transferred into the Integrated Fuse-Master Latch 43 of the next device 31 (e.g., device 31-2 as depicted in FIG. 3b). That is, the data asserted by the normal forward inverter 48 of a slave latch 46 (e.g., in 31-1) will overdrive the weak feedback inverter (i.e., comprised of transistors TP1 and TN4) of an Integrated Fuse-Master Latch 43 (e.g., in 31-2). Then, the output of the forward inverter 49 of the Integrated Fuse-Master Latch 43 (e.g., in 31-2), will drive the weak feedback inverter (i.e., comprised of transistors TP1 and TN4) of the Integrated Fuse-Master Latch 43 (e.g., in 31-2) so as to create a positive feedback, and thus, creating a bistable Integrated Fuse-Master Latch 43 (e.g., in 31-2) for storing the information serially input via line SCANIN.

The Integrated Shift-Register Fuse Programming and Verification (ISRFPAV) device 31 performs programming of the included two-state element 12 and performs verification of the state of the two-state element 12 after such programing, in the same manner as the three-latch embodiment of FIG. 2a. Because the functions of the shift register master latch 44 and of the fuse latch 43 of the three-latch embodiment 201 in FIG. 2a are all being performed by the Integrated Fuse-Master Latch 43 in the device 31 in FIG. 3a, the external connections "IN" and "OUT" of the FPAV device 21 of the three-latch embodiment 201 in FIG. 2a are replaced with internal connections within device 31. Similarly, the Tristate driver 55b of discrete FPAV 21 is eliminated from the FPAVISR circuit 31, and signals ENB and LOADP are eliminated from FPAVISR circuit 31.

Within FPAVISR circuit 31, the logic gate 10 (e.g., NOR1 in FIG. 3a) controlling pass-switch transistor TN7 has a first input from a connection to the COMP line/node of the Integrated Fuse-Master Latch 43, and a second input from the external (active Low) control signal PROFN. An antifuse or other two-state element 12 will be "blown" when: the voltage on line/node COMP is at logic Low (i.e., when the voltage on line/node TRUE is at logic High); and when PROgram-Fuse-Not control signal PROFN is asserted (i.e., at a logic Low voltage); and the voltage on line FSOURCE is sufficiently high (e.g., between 2 volts and 10 volts) to change the state of the two-state element 12 from its original state to a programmed (i.e., "blown") antifuse state.

FIG. 3b depicts a bank of serially connected Integrated Shift-Register Fuse Programming and Verification (ISRFPAV) devices (31-1, 31-2, 31-3 etc.). The timing diagram of FIG. 4 (ignoring signals ENB and LOADP which are unique to FPAV device 21) illustrates the details and manner of the operation of the FPAVISR circuit 31 of FIG. 3a (e.g., 31-1, 31-2, 31-3, . . . 31-N of FIG. 3b). As depicted in the timing diagram in FIG. 4, data that enters the first FPAVISR circuit 31-1 at SIN will be serially scanned through the bank of FPAVISR circuits (31-1, 31-2, 31-3 etc.) until the time Ready-To-Program when such data shall have been stored in the integrated fuse-master latch 43 of each of the FPAVISR circuit (31-1, 31-2, 31-3 etc.) The programming data may also then be asserted in-parallel at the outputs of each FPAVISR circuit (e.g., POUT-1, POUT-2, POUT-3, SOUT etc.) as depicted in FIG. 4.

When appropriate the fuse programming data is stored in the integrated fuse-master latch 43 of each FPAVISR circuit 31, programming of the two-state element 12 may be performed in the same manner as in the FPAV device 21 in FIG. 2b. To program the two-state element 12 in a given FPAVISR circuit 31, the active-Low PROgram-Fuse-Not signal PROFN is asserted (held Low) such that logic gate 10 (e.g., NOR1) will output an active-High PROGram-fuse-True signal PROGT depending upon the logic value of the Bit of fuse programming data asserted at line IN. As illustrated in timing diagram of FIG. 4, the signal PROFN will be asserted (i.e., held Low) for a period of time sufficient to allow the state of the two-state element 12 to be reliably programmed according to the programming data. The signal PROFN may be asserted at different times at each FPAVISR circuit 31 in order to reduce the maximum current and/or energy required to be transmitted in order to program all two-state elements.

Figure 3C:
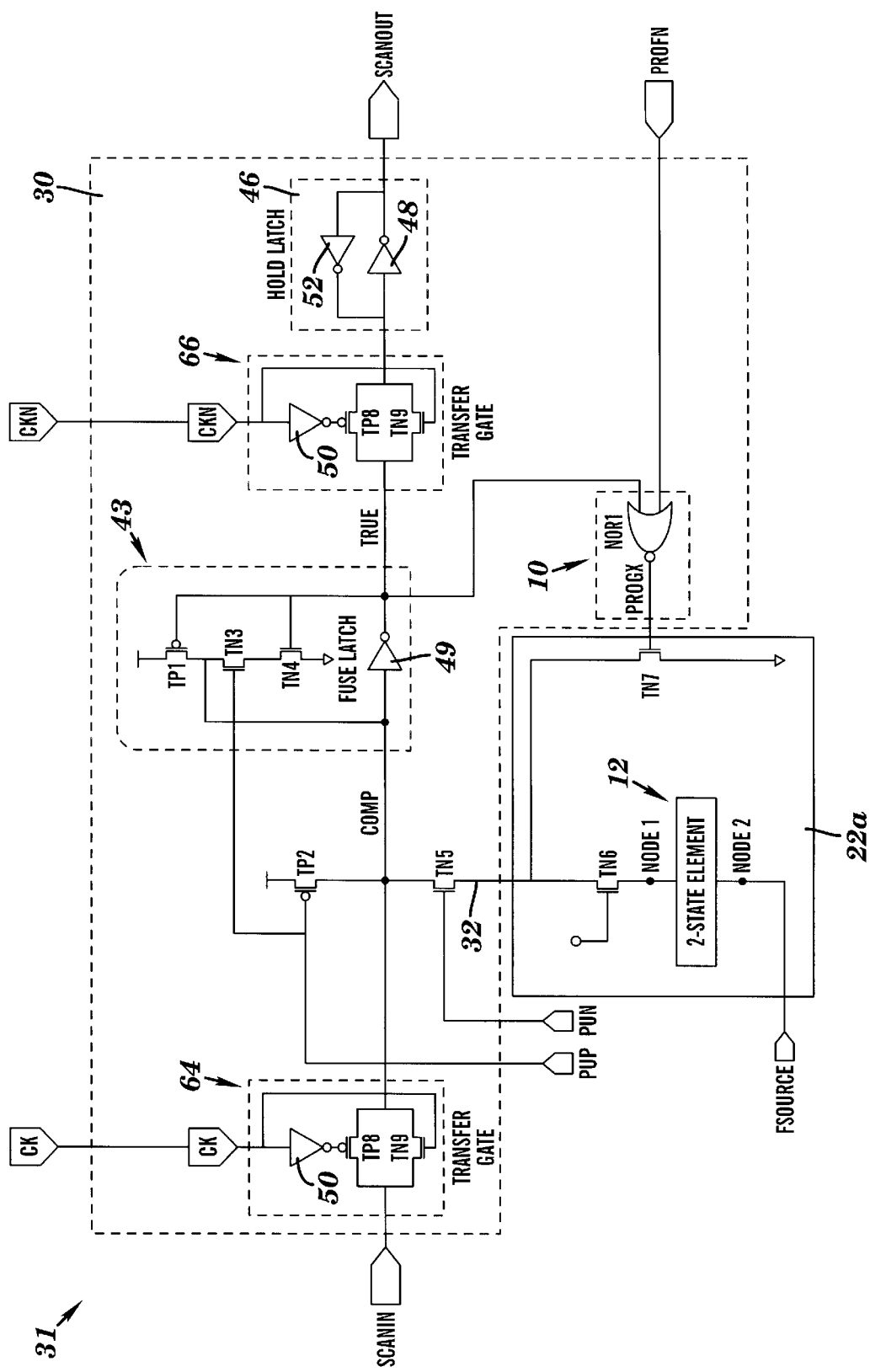

FIG. 3c depicts an alternative embodiment of the FPAVISR circuit 31 of FIG. 3a, wherein the logic gate 10 (i.e. NOR1) is coupled to the TRUE line/node of the integrated fuse master latch 43 instead of the COMP node of latch 43. This configuration functions the same as the device 31 of FIG. 3a except that the fuse programming operation will result in the logical complement of the programing data being written to the two-state element 12.

Figure 3D:
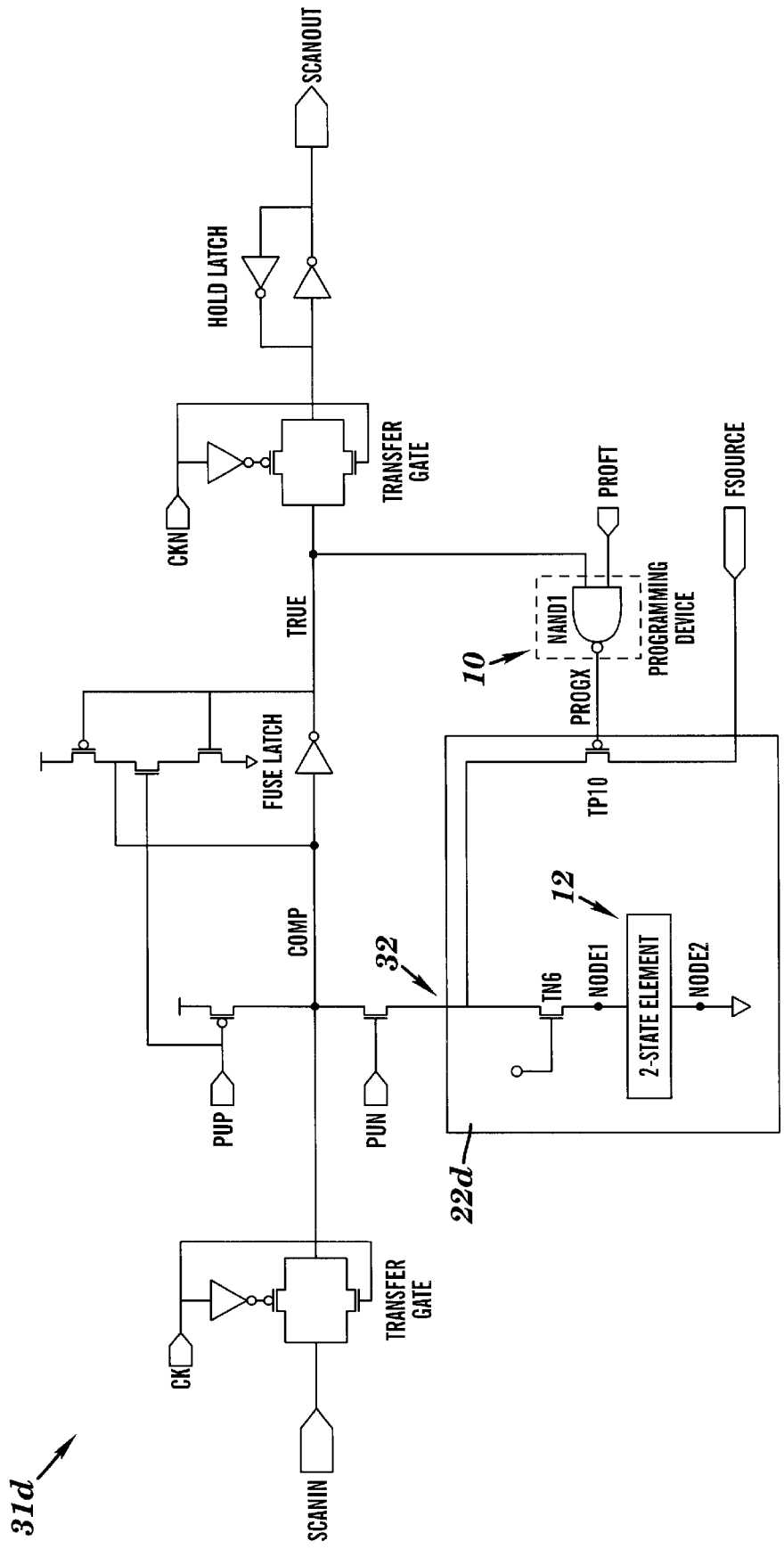

FIG. 3d depicts an alternative embodiment of the FPAVISR circuit 31 of FIG. 3a, wherein the logic gate 10 is implemented as a NAND gate (NAND1) (i.e., instead of a NOR gate (e.g. NOR1)) that is coupled to the TRUE line/node of the latch 43 instead of the COMP node of latch 43. In this configuration, the FPAVISR circuit 31d functions comparably to the FPAVISR circuit 31 of FIG. 3a, with modifications to the sense and arrangement of signals. The signals controlling the logic gate 10 (i.e., TRUE and PROFT) in FIG. 3d are active-High instead of active-Low, such that pass-gate TP10 is ON (i.e. conducting) only when both line TRUE and signal PROFT are at a logic High voltage.

The two-state device 22d in the FPAVISR circuit 31d of FIG. 3d is arranged such that Node 2 of the two-state element 12 may be coupled directly to Ground, rather than to a variable voltage line (e.g., FSOURCE) as in FIGS. 3a and 3b. Accordingly, the state of the two-state element may be read regardless of the voltage on Line FSOURCE, provided that pass-gate TP10 is OFF (i.e., nonconducting). Because the high voltage line FSOURCE is coupled directly to a terminal (e.g., the source) of pass-gate transistor TP10, the pass-gate transistor is preferably implemented as a PFET, instead of as an NFET as in circuit 22a of FIG. 3a. The other terminal of pass-gate transistor TP10 may be coupled directly to Node 1 of the two-state element so that the protection FET TN6 is disposed between the high voltage line FSOURCE and the line 32 that is coupled to the latch 43.

Figure 3E:
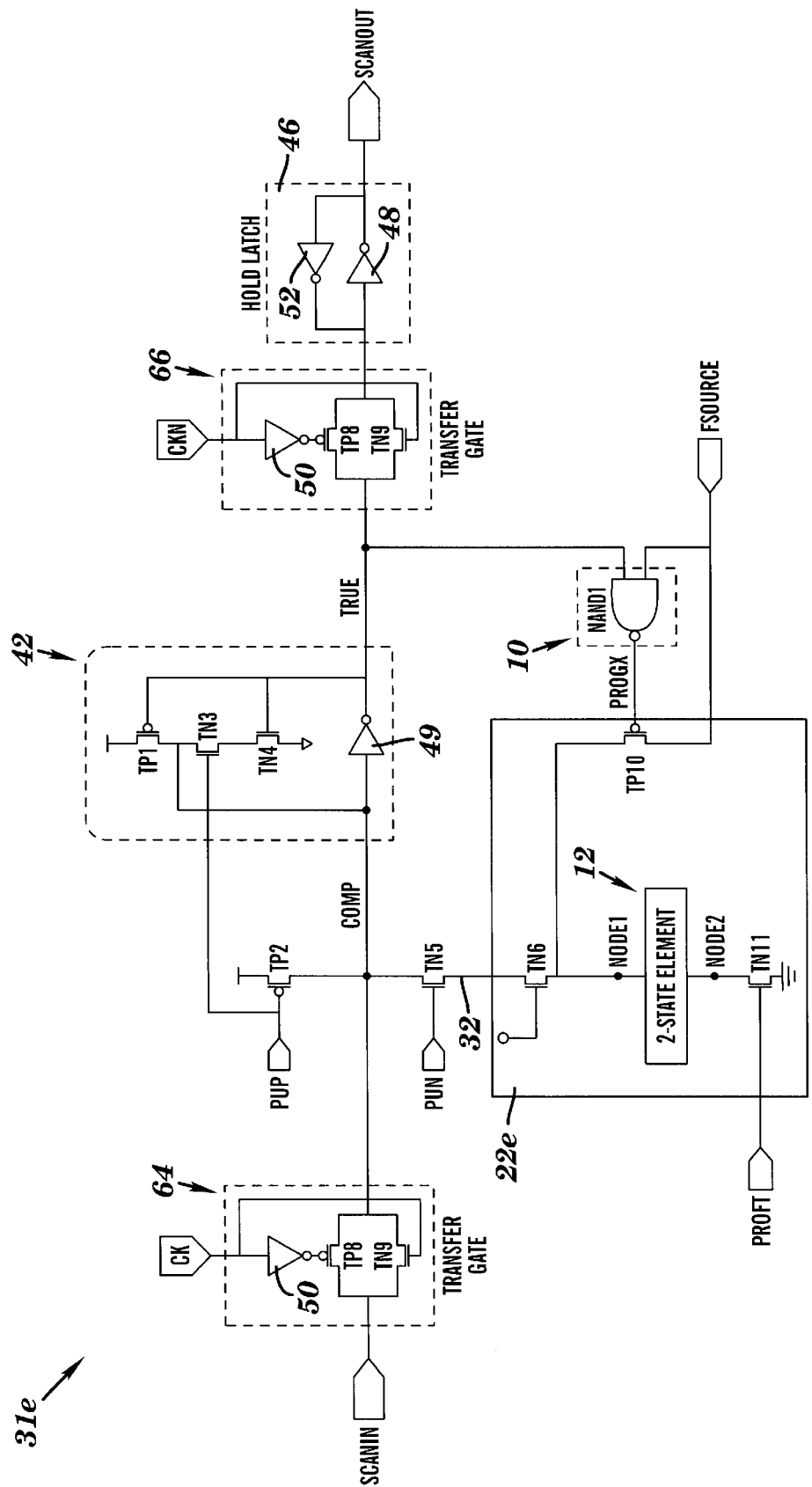

FIG. 3e depicts an alternative embodiment of the FPAVISR circuit 31d of FIG. 3d, wherein the discrete active-High control signal PROFT has been eliminated as a result of being replaced by the high voltage FSOURCE line. In this configuration, the FPAVISR circuit 31e functions comparably to the FPAVISR circuit 31d of FIG. 3d except that fewer lines are necessary to operate the programming function of the FPAVISR circuit 31d. The signals controlling the logic gate 10 (i.e., TRUE and FSOURCE) in FIG. 3e are active-High as in FIG. 3d, such that pass-gate TP10 is ON (i.e. conducting) when both line TRUE and line source are at a voltage equal to or greater than the nominal logic High voltage. Because FSOURCE may exceed the nominal logic High voltage, the logic gate 10 (e.g., NAND1) must be designed to withstand the higher voltage input from FSOURCE and to function logically as a normal NAND gate. Alternatively the high voltage on line FSOURCE could be buffered to a nominal logic High voltage (e.g., by one or more series-connected CMOS inverters) into the logic gate 10.

In concluding the detailed description, it is noted that it would be apparent to persons skilled in the art that many variations and modifications may be made to the exemplary embodiments herein described without substantially departing from the principles of the present invention. All such variations and modifications are intended to be included herein within the scope of the present invention, as set forth by the following claims. Further, in the claims hereafter, the structures, materials, acts, recited are intended to include any functionally equivalent structures, materials, or acts adapted to performing the recited functions.

We claim:

1. A device for programming and verifying a non-volatile two-state element, the device comprising:
   a two-state element having a binary conductive state;
   a first latch operatively coupled to the two-state element and adapted to sense the conductive state of the two-state element, and further adapted to store a binary bit representing the conductive state, and further adapted to receive and to store a binary bit of programing data; and
   a logic gate operatively coupled to the two-state element for changing the conductive state of the two-state element according to the binary bit of programing data.

2. The device of claim 1 wherein the two-state element includes a wire fuse.

3. The device of claim 1 wherein the two-state element includes an antifuse.

4. The device of claim 1 wherein the two-state element includes a mechanical switch.

5. The device of claim 1 further comprising a slave latch of a shift-register and a transfer gate disposed between the first latch and the slave latch.

6. The device of claim 5, wherein the first latch is a master latch of the shift-register in relation to the slave latch.

7. A device for programming and verifying a non-volatile two-state element, the device comprising:
   a two-state element having a binary conductive state;
   a first latch operatively coupled to the two-state element and adapted to sense the conductive state of the two-state element, and further adapted to store a binary bit representing the conductive state;
   a logic gate operatively coupled to the two-state element for changing the conductive state of the two-state element according to a binary bit of programing data; and a shift register, the shift register being operatively coupled to an input of the logic gate and being adapted to scan-in the bit of programming data and to scan-out the stored bit representing the conductive state.

8. The device of claim 7, wherein the shift register includes a master latch and a slave latch, and wherein the first latch is the master latch.

9. The device of claim 8 wherein an initial conductive state of the two-state element is a Low Resistance and the corresponding value of the binary bit is a logic High voltage.

10. The device of claim 8 wherein an initial conductive state of the two-state element is a High Resistance and the corresponding value of the binary bit is a logic Low voltage.

11. A device for programming and verifying a non-volatile two-state element, the device comprising:
   a two-state element having a binary conductive state;
   a first latch operatively coupled to the two-state element and adapted to sense the conductive state of the two-state element, and further adapted to store a binary bit representing the conductive state;
   a logic gate operatively coupled to the two-state element for changing the conductive state of the two-state element according to a binary bit of programing data; and
   a pass-switch operatively coupled between the first latch and the two-state element.

12. A device for programming and verifying a non-volatile two-state element, the device comprising:
   a two-state element having a binary conductive state;
   a first latch operatively coupled to the two-state element and adapted to sense the conductive state of the two-state element, and further adapted to store a binary bit representing the conductive state, the first latch being further adapted to receive and to store programing data; and
   a logic gate operatively coupled to the two-state element for changing the conductive state of the two-state element according to a binary bit of programing data.

13. A device for programming and verifying a non-volatile two-state element, the device comprising:
   a two-state element having a binary conductive state;
   a first latch operatively coupled to the two-state element and adapted to sense the conductive state of the two-state element, and further adapted to store a binary bit representing the conductive state;
   a logic gate operatively coupled to the two-state element for changing the conductive state of the two-state element according to a binary bit of programing data; and
   a tri-state driver operatively coupled to an output of the first latch.

14. A device for programming and verifying a non-volatile two-state element, the device comprising:
   a two-state element having a binary conductive state;
   a first latch operatively coupled to the two-state element and adapted to sense the conductive state of the two-state element, and further adapted to store a binary bit representing the conductive state;
   a logic gate operatively coupled to the two-state element for changing the conductive state of the two-state element according to a binary bit of programing data; and
   a hold latch operatively coupled to an output of the first latch.

15. The device of claim 14 further comprising a transfer gate disposed between the first latch and a slave latch of a shift-register.

16. The device of claim 15, wherein the first latch is a master latch of the shift-register in relation to slave latch.

17. A method for programming and verifying a plurality of two-state elements, the method comprising:
   providing a plurality of devices, each device being adapted to change and to verify the binary conductive state of one two-state element, each device including a first latch adapted to sense and to store the conductive state of one two-state element as a binary bit of verification data representing the conductive state;
   providing a shift register bank adapted to scan programming data into the plurality of first latches and to scan the verification data out of the plurality of first latches;
   scanning in programming data into the plurality of first latches;
   changing the conductive state of each two-state element of a subset of the plurality of two-state elements according to the programing data;
   sensing the conductive states of all the two-state elements and storing the conductive states in the plurality of first latches as binary verification data; and
   scanning out the verification data.

18. The method of claim 17 wherein changing the conductive state of one two-state element according to the programing data includes:
   applying a current across the two-state element.

19. The method of claim 14 wherein changing the conductive state of one two-state element according to the programing data includes:
   asserting a voltage across the two-state element.

20. The method of claim 17 wherein sensing the conductive state of one two-state element includes;
   intializing the first latch to a pre-determined binary logic state.

21. The method of claim 17 wherein sensing the conductive state of one two-state element includes;
   sensing a voltage on a node of the two-state element.

22. The method of claim 17 wherein sensing the conductive state of one two-state element includes;
   sensing the electric current running through the two-state element.

23. A chip package comprising:
   a device for programming and verifying a non-volatile two-state element, the device including:
      a two-state element having a binary conductive state;
      a first latch operatively coupled to the two-state element and adapted to sense the conductive state of the two-state element, and further adapted to store a binary bit representing the conductive state, and further adapted to receive and to store a binary bit of programing data;
      a logic gate operatively coupled to the two-state element for changing the conductive state of the two-state element according to the binary bit of programing data.

24. A method for programming and verifying a plurality of two-state elements, the method comprising:
   providing a plurality of devices, each device being adapted to change and to verify the binary conductive state of one two-state element, each device including a latch adapted to sense and to store the conductive state of one two-state element as a binary bit of verification data representing the conductive state;

providing a shift register bank adapted to scan in programming data and to scan out the verification data;

scanning programming data into the plurality of latches via the shift register bank;

changing the conductive state of each two-state element of a subset of the plurality of two-state elements according to the programing data;

sensing the conductive states of all the two-state elements and storing the conductive states in the plurality of latches as binary verification data; and scanning the verification data out via the shift register bank.

* * * * *